(12) United States Patent
Park

(10) Patent No.: US 7,750,387 B2
(45) Date of Patent: Jul. 6, 2010

(54) SEMICONDUCTOR DEVICE AND METHOD OF FABRICATING THE SAME

(75) Inventor: Sung Kun Park, Cheongju-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 43 days.

(21) Appl. No.: 12/329,714

(22) Filed: Dec. 8, 2008

(65) Prior Publication Data

US 2009/0166697 A1  Jul. 2, 2009

(30) Foreign Application Priority Data

Dec. 27, 2007  (KR) .................... 10-2007-0139267

(51) Int. Cl.
  *H01L 29/788* (2006.01)
  *H01L 29/423* (2006.01)
  *H01L 21/336* (2006.01)

(52) U.S. Cl. .............. 257/300; 257/296; 257/306; 257/315; 257/316; 257/E29.3; 257/E29.129; 257/E21.422; 438/257; 438/593

(58) Field of Classification Search ............. 257/296, 257/300, 306, 315, 316, E29.3, E29.129, 257/E21.422; 438/257, 593
See application file for complete search history.

(56) References Cited

U.S. PATENT DOCUMENTS

| | | | | |
|---|---|---|---|---|
| 4,888,630 A | * | 12/1989 | Paterson | 365/185.24 |
| 6,259,126 B1 | * | 7/2001 | Hsu et al. | 257/298 |
| 6,528,842 B1 | * | 3/2003 | Luich et al. | 257/315 |
| 6,753,560 B2 | * | 6/2004 | Kato et al. | 257/295 |
| 2001/0054732 A1 | * | 12/2001 | Kato et al. | 257/306 |
| 2002/0024083 A1 | * | 2/2002 | Noble et al. | 257/306 |
| 2002/0043676 A1 | * | 4/2002 | Ohtsuka et al. | 257/295 |
| 2009/0020800 A1 | * | 1/2009 | Tempel et al. | 257/316 |

FOREIGN PATENT DOCUMENTS

KR  100667916 B1  1/2007

* cited by examiner

*Primary Examiner*—Victor A Mandala
(74) *Attorney, Agent, or Firm*—Saliwanchik, Lloyd & Saliwanchik

(57) ABSTRACT

Disclosed are a semiconductor device and method of fabricating the same. The semiconductor device includes a floating gate on a semiconductor layer; a first contact on the floating gate; a MIM capacitor including a lower electrode, an insulating layer, and an upper electrode on the first contact; a second contact on a drain region of the semiconductor layer; a metal island on the second contact; a via on the metal island; and a bit line on the via.

17 Claims, 2 Drawing Sheets

SEMICONDUCTOR DEVICE AND METHOD OF FABRICATING THE SAME

CROSS-REFERENCE TO RELATED APPLICATION

The present application claims priority under 35 U.S.C. §119 to Korean Patent Application No. 10-2007-0139267, filed Dec. 27, 2007, which is hereby incorporated by reference in its entirety.

BACKGROUND

Generally, semiconductor devices such as a display driving circuit and a single chip sensor require non-volatile memory in order to correct devices.

Such a non-volatile memory must be suitable for reducing additional processes. In addition, the non-volatile memory must have superior process compatibility and must be programmed before a finished product is launched such that the non-volatile memory can be tuned suitably for various sensors.

Accordingly, studies and research have been performed regarding a semiconductor device and a method of fabricating the same, capable of satisfying the above conditions.

BRIEF SUMMARY

Embodiments of the present invention provide a semiconductor device and a method of fabricating the same, capable of realizing a non-volatile memory through a manufacturing process compatible with a manufacturing process for a circuit part.

According to an embodiment, a semiconductor device includes a floating gate on a semiconductor layer; a first contact on the floating gate; a MIM capacitor including a lower electrode, an insulating layer, and an upper electrode on the first contact; a second contact on a drain region of the semiconductor layer; a metal island on the second contact; a via on the metal island; and a bit line on the via.

According to an embodiment, a method of fabricating a semiconductor device can include forming a floating gate on a semiconductor layer: forming a first contact on the floating gate; forming a second contact in a drain area of the semiconductor layer; forming a MIM capacitor including a lower electrode, an insulating layer, and an upper electrode on the first contact; forming a metal island on the second contact; forming a via on the metal island; and forming a bit line on the via.

As described above, in the semiconductor device and the method of fabricating the same, the non-volatile memory can be realized through a manufacturing process compatible with a manufacturing process of a circuit part.

DETAILED DESCRIPTION

Embodiments of the present invention are applicable to a non-volatile memory. More particularly, an embodiment is applicable to a non-volatile memory constructed in the form of a single chip together with a display driving circuit and a sensor circuit.

Figure 1:
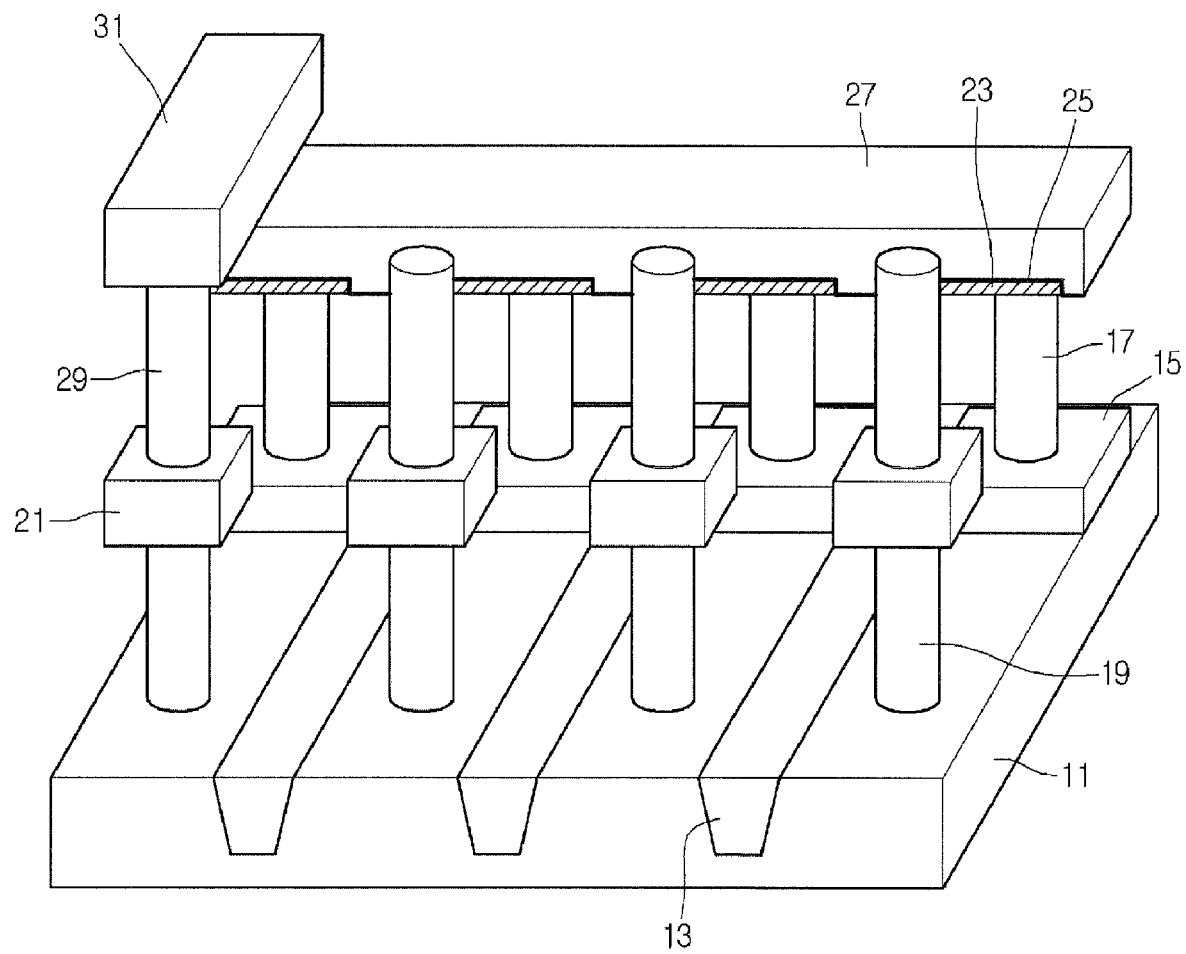
FIG. 1 is a perspective view showing a semiconductor device according to an embodiment of the present invention.
Figure 2:
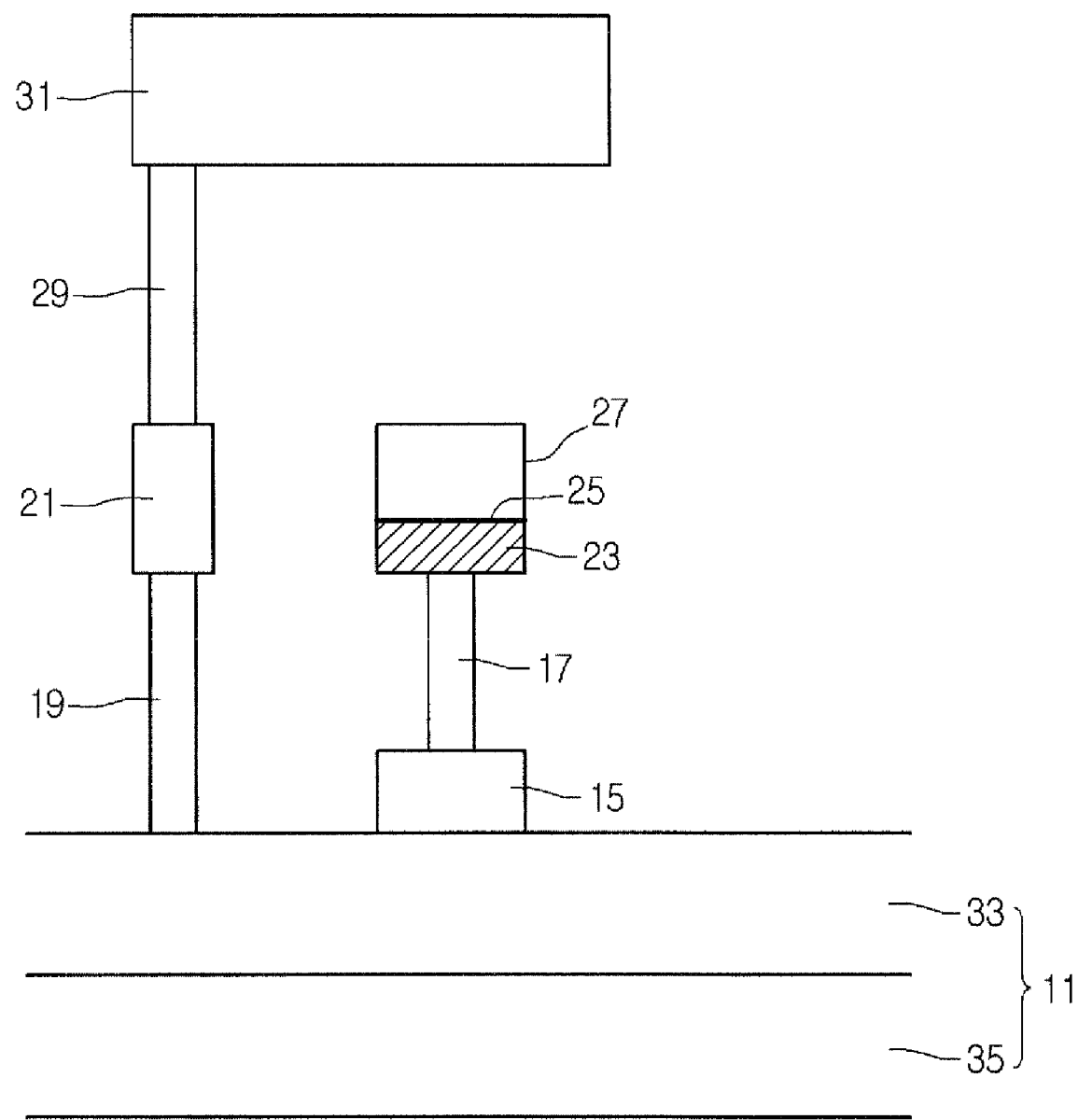
FIG. 2 is a cross-sectional view showing a semiconductor device according to an embodiment of the present invention.

FIG. 1 is a perspective view showing a semiconductor device according to an embodiment, and FIG. 2 is a cross-sectional view taken along a bit line direction of the semiconductor device shown in FIG. 1 in accordance with an embodiment of the present invention.

As shown in FIGS. 1 and 2, in the semiconductor device according to an embodiment, a floating gate 15 is formed on a semiconductor layer 11, and a MIM capacitor is formed on the floating gate 15. The MIM capacitor includes a lower electrode 23, an insulating layer 25, and an upper electrode 27. The floating gate 15 is connected to the MIM capacitor through a first contact 17. The lower electrode 23 of the MIM capacitor is connected to the floating gate 15 through the first contact 17. A reference number 13 represents a device isolation layer.

The lower electrode 23 of the MIM capacitor can include a metal layer including Ti, TiN, or Ti/TiN. In addition, the insulating layer 25 of the MIM capacitor can have an oxide layer/nitride layer/oxide layer structure or a nitride layer/oxide layer structure. The upper electrode 27 of the MIM capacitor can include a metal layer including aluminum or aluminum alloy. In another embodiment, the upper electrode 27 can include a metal layer including copper.

A second contact 19 is formed on a drain region of the semiconductor layer 11. In addition, a metal island 21 can be formed on the second contact 19, and a via 29 is formed on the metal island 21. A bit line 31 is formed on the via 29. Accordingly, the bit line 31 is electrically connected to the drain region through the second contact 19, the metal island 21, and the via 29. The metal island 21 and the upper electrode 27 of the MIM capacitor may be formed on the same layer. The metal island 21 can include the same material as that of the upper electrode 27 of the MIM capacitor. The bit line 31 can include a metal layer.

The bit line 31 is formed in a first direction, and the upper electrode 27 of the MIM capacitor is formed in a second direction perpendicular to the first direction. The upper electrode 27 can serve as a function of a word line. In addition, the bit line 31 and the upper electrode 27 of the MIM capacitor can be arranged in a lattice shape.

According to an embodiment, the MIM capacitor can serve as a control gate function of a flash cell. In other words, the MIM capacitor may form a flash cell with the floating gate 15. As shown in FIG. 2, the semiconductor layer 11 can include a P-well 33 and an N-well 35 formed below the floating gate 15. The P-well 33 may be formed in the N-well 35 while being insulated from the N-well 35. A sector of the memory device portion can be erased by using the P-well 33 and the N-well 35.

As described above, embodiments of the present invention are applicable to a case in which a memory is embedded in a circuit part. The MIM capacitor is applicable for the circuit part through the same processes, and connected to the floating gate 15 through the first contact 17 in a memory region, so that the flash cell can be realized.

The lower electrode 23 of the MIM capacitor can be patterned in the first direction in which the bit line 31 is formed, and the upper electrode 27 formed on the lower electrode 23 can serve as a common plate. Accordingly, the upper electrode 27 can serve as a function of a word line.

In addition, the bit line 31 and the upper electrode 27 of the MIM capacitor are arranged in a lattice shape. Accordingly, a desired position of a flash cell may be easily selected through the selection of the bit line 31 and the upper electrode 27.

The semiconductor device may be formed through the following process.

According to an embodiment, a floating gate 15 can be formed on the semiconductor layer 11.

A first contact 17 can be formed on the floating gate 15, and a second contact 19 can be formed on a drain region of the semiconductor layer 11. The first contact 17 and the second contact 19 can be formed through via hole formation and metal plug formation processes. In one embodiment, the first contact 17 and the second contact 19 can be simultaneously formed.

The MIM capacitor can be formed on the first contact 17, and the metal island 21 can be formed on the second contact 19. The MIM capacitor can include the lower electrode 23, the insulating layer 25, and the upper electrode 27. Interlayer dielectric layers (not shown) can be formed between the floating gate 15 and the MIM capacitor and metal island 21 layers.

The lower electrode 23 of the MIM capacitor can include a metal layer including Ti, TiN, or Ti/TiN. In addition, the insulating layer 25 of the MIM capacitor can have an oxide layer/nitride layer/oxide layer structure or a nitride layer/oxide layer structure. The upper electrode 27 of the MIM capacitor can include a metal layer including aluminum, aluminum alloy, or copper.

The floating gate 15 is connected to the MIM capacitor through the first contact 17. In detail, the lower electrode 23 of the MIM capacitor is connected to the floating gate 15 through the first contact 17.

Then, a via 29 can be formed on the metal island 21, and the bit line 31 can be formed on the via 29. An interlayer dielectric (not shown) can be formed between the metal island 21 and the bit line 31 with the via 29 passing therethrough.

The bit line 31 is formed in the first direction, and the upper electrode 27 of the MIM capacitor is formed in the second direction perpendicular to the first direction. An interlayer dielectric (not shown) can be formed between the upper electrode 27 and the bit line 31. The upper electrode 27 may serve as a function of a word line. The bit line 31 and the upper electrode 27 of the MIM capacitor can be arranged in a lattice shape.

According to an embodiment, the MIM capacitor may serve as a control gate function of a flash cell. In other words, the MIM capacitor can form the flash cell together with the floating gate 15.

As described above, the embodiment is usefully applicable to a case in which a memory is embedded in a circuit part. The MIM capacitor is applicable for the circuit part through the same processes, and connected to the floating gate 15 through the first contact 17 in a memory region, so that the flash cell can be realized.

The lower electrode 23 of the MIM capacitor can be patterned in the first direction in which the bit line 31 is formed, and the upper electrode 27 formed on the lower electrode 23 can serve as a common plate. Accordingly, the upper electrode 27 may serve as a function of a word line.

In addition, the bit line 31 and the upper electrode 27 of the MIM capacitor are arranged in a lattice shape. Accordingly, a desired position of a flash cell may be easily selected through the selection of the bit line 31 and the upper electrode 27.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is

1. A semiconductor device comprising:
   a floating gate on a semiconductor layer;
   a first contact on the floating gate;
   a MIM capacitor including a lower electrode, an insulating layer, and an upper electrode on the first contact;
   a second contact on a drain region of the semiconductor layer;
   a metal island on the second contact;
   a via on the metal island; and
   a bit line on the via.

2. The semiconductor device of claim 1, wherein the MIM capacitor serves as a control gate function of a flash cell.

3. The semiconductor device of claim 1, wherein the upper electrode serves as a function of a word line.

4. The semiconductor device of claim 1, wherein the lower electrode comprises titanium (Ti), titanium nitride (TiN), or a titanium/titanium nitride (Ti/TiN) stack.

5. The semiconductor device of claim 1, wherein the metal island and the upper electrode are formed on a same layer.

6. The semiconductor device of claim 1, wherein the upper electrode comprises aluminum or aluminum alloy.

7. The semiconductor device of claim 1, wherein the upper electrode comprises copper.

8. The semiconductor device of claim 1, wherein the insulating layer comprises an oxide layer/nitride layer/oxide layer structure.

9. The semiconductor device of claim 1, wherein the insulating layer comprises a nitride layer/oxide layer structure.

10. A method of fabricating a semiconductor device, the method comprising:
    forming a floating gate on a semiconductor layer;
    forming a first contact on the floating gate, and forming a second contact on a drain area of the semiconductor layer;
    forming a MIM capacitor including a lower electrode, an insulating layer, and an upper electrode on the first contact, and forming a metal island on the second contact;
    forming a via on the metal island; and
    forming a bit line on the via.

11. The method of claim 10, wherein the MIM capacitor serves as a control gate function of a flash cell.

12. The method of claim 10, wherein the upper electrode serves as a function of a word line.

13. The method of claim 10, wherein the lower electrode comprises titanium (Ti), titanium nitride (TiN), or a titanium/titanium nitride (Ti/TiN) stack.

14. The method of claim 10, wherein the upper electrode comprises aluminum or aluminum alloy.

15. The method of claim 10, wherein the upper electrode comprises copper.

16. The method of claim 10, wherein the insulating layer comprises an oxide layer/nitride layer/oxide layer structure.

17. The method of claim 10, wherein the insulating layer comprises a nitride layer/oxide layer structure.

* * * * *